(12) United States Patent
Shao et al.

(10) Patent No.: US 11,129,292 B1
(45) Date of Patent: Sep. 21, 2021

(54) CONNECTOR INTERFACE FOR LIQUID-COOLED IT SERVERS

(71) Applicant: Baidu USA LLC, Sunnyvale, CA (US)

(72) Inventors: Shuai Shao, Milpitas, CA (US); Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/904,005

(22) Filed: Jun. 17, 2020

(51) Int. Cl.
| | |
|---|---|
| *G06F 1/16* | (2006.01) |
| *H05K 5/00* | (2006.01) |
| *H05K 7/00* | (2006.01) |
| *H05K 7/14* | (2006.01) |
| *H05K 7/20* | (2006.01) |

(52) U.S. Cl.
CPC ........ *H05K 7/1438* (2013.01); *H05K 7/1485* (2013.01); *H05K 7/20272* (2013.01)

(58) Field of Classification Search
CPC .. H05K 7/1438; H05K 7/1485; H05K 7/1439; H05K 7/1452; H05K 7/1454; H05K 7/1487; H05K 7/1488; H05K 7/1489
See application file for complete search history.

(56) References Cited

U.S. PATENT DOCUMENTS

| | | | | |
|---|---|---|---|---|
| 9,086,859 | B2 * | 7/2015 | Attlesey | H05K 5/067 |
| 9,332,673 | B2 * | 5/2016 | Boday | F28D 15/02 |
| 9,420,728 | B2 * | 8/2016 | Desiano | H05K 7/20263 |
| 9,445,526 | B2 * | 9/2016 | Zhou | H01L 23/4735 |
| 9,591,787 | B2 * | 3/2017 | Arvelo | G06F 1/20 |
| 9,622,379 | B1 * | 4/2017 | Campbell | H05K 7/20318 |
| 9,654,017 | B2 * | 5/2017 | Borisov | H05K 7/20354 |
| 9,668,382 | B2 * | 5/2017 | Steinke | H05K 7/20736 |
| 10,390,458 | B2 * | 8/2019 | Tufty | H05K 7/20263 |
| 10,582,640 | B2 * | 3/2020 | Cader | H05K 7/20281 |
| 10,917,998 | B2 * | 2/2021 | Shelnutt | H05K 7/20772 |

* cited by examiner

*Primary Examiner* — Anthony M Haughton
(74) *Attorney, Agent, or Firm* — Womble Bond Dickinson (US) LLP

(57) ABSTRACT

Embodiments are disclosed of a fluid connector including a connector body having at least a first exterior surface and a second exterior surface. A male interface projects longitudinally from the first exterior surface and includes a male internal chamber bounded in part by a pair of spaced-apart laterally-moving fluid gates coupled to each other by a first elastic member. A female interface longitudinally adjacent to the male interface is recessed into the first exterior surface. The female interface includes a female internal chamber bounded in part by a longitudinally-moving fluid gate, the longitudinally-moving fluid gate being biased into its closed position by a second elastic member. A plurality of fluid distribution ports are positioned on the second surface, each being fluidly coupled to the male interface, the female interface, or both.

20 Claims, 7 Drawing Sheets

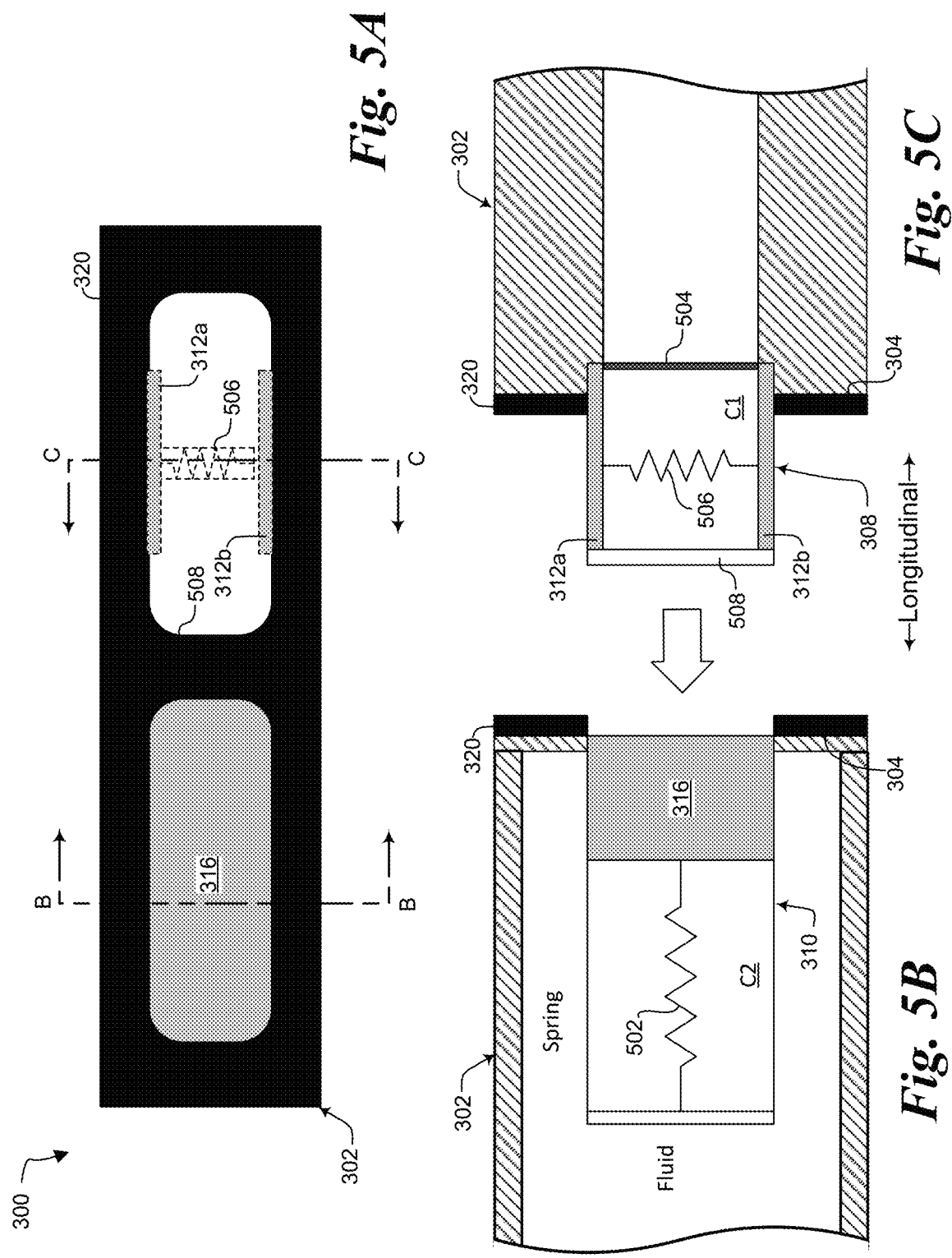

CONNECTOR INTERFACE FOR LIQUID-COOLED IT SERVERS

TECHNICAL FIELD

The disclosed embodiments relate generally to liquid-cooled IT servers and in particular, but not exclusively, to connector interface for liquid-cooled IT servers.

BACKGROUND

Much modern information technology (IT) equipment such as servers, blade servers, routers, edge servers, etc., generates a substantial amount of heat during operation. The heat generated by individual components, especially high-power components such as processors, makes many of these individual components impossible or difficult to cool effectively with air cooling systems. Much IT equipment therefore requires liquid cooling.

As a result of the requirement for liquid cooling, some pieces of IT equipment have an on-board cooling system that is thermally coupled to the individual components that need cooling. But these on-board cooling systems usually do not operate in isolation. They are usually coupled to at least one larger cooling system, such as liquid cooling system in an electronics rack. The rack's cooling system can in turn be coupled to the liquid cooling system of a larger facility such as a data center. In such a system, the data center's cooling system circulates a working fluid through the rack cooling system, which in turn circulates the working fluid through the cooling system on the piece of IT equipment.

This type of multi-level cooling system requires many fluid connections, but the many connections also provide many opportunities for fluid leaks that can be harmful or fatal to the electronic components. Moreover, in some applications the connections can be in locations that are very difficult to reach, making manual connection more difficult and further increasing the opportunities for leaks.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 5A-5C together are views of an embodiment of a fluid connector such as the one shown in FIG. 4 showing details of its construction. FIG. 5A is a front view, FIG. 5B is a cross-sectional view taken along section line B-B in FIG. 5A, and FIG. 5C is a cross-sectional view taken along section line C-C in FIG. 5A FIGS. 6A-6B are cross-sectional views of embodiments of the operation of, and fluid flow in, the male and female interfaces in a pair of fluid connectors such as the one shown in FIG. 3.

DETAILED DESCRIPTION

Embodiments are described of connector interfaces for liquid-cooled IT servers. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics can be combined in any suitable manner in one or more embodiments.

Cooling connections usually require manual operation to finish the connector mating, and they also need hoses. The disclosed embodiments are of a new connector that improves the reliability and reduces the liquid leakage risk of components, by eliminating the need for manual connection of liquid loops in server chassis to a rack manifold. Also the disclosed embodiments provide a universal design for connectors which do not separate a male side for female side. This significantly increases the ease of building and assembling connectors in actual use cases. In addition, the disclosed embodiments provide integrated solutions for better fluid management and distribution and at the same time improve fluid transfer efficiency.

The disclosed embodiments are of a connector placed in an IT server for liquid cooling solution. It includes a blind-mating feature and flow distribution feature. The dripless blind-mate feature is for connecting to a rack manifold for liquid cooling, which simply requires the operator push a server into a rack and close the latches. The flow distribution feature makes the connector work as a mini-manifold in the server chassis. Among other features and advantages, the connector design includes rounded rectangular male and female interfaces; has a blind-mate feature on the male/female interface side and can be substantially dripless; distributes a liquid flow to multiple fluid distribution ports; and can work the same in multiple orientations.

Figure 1:
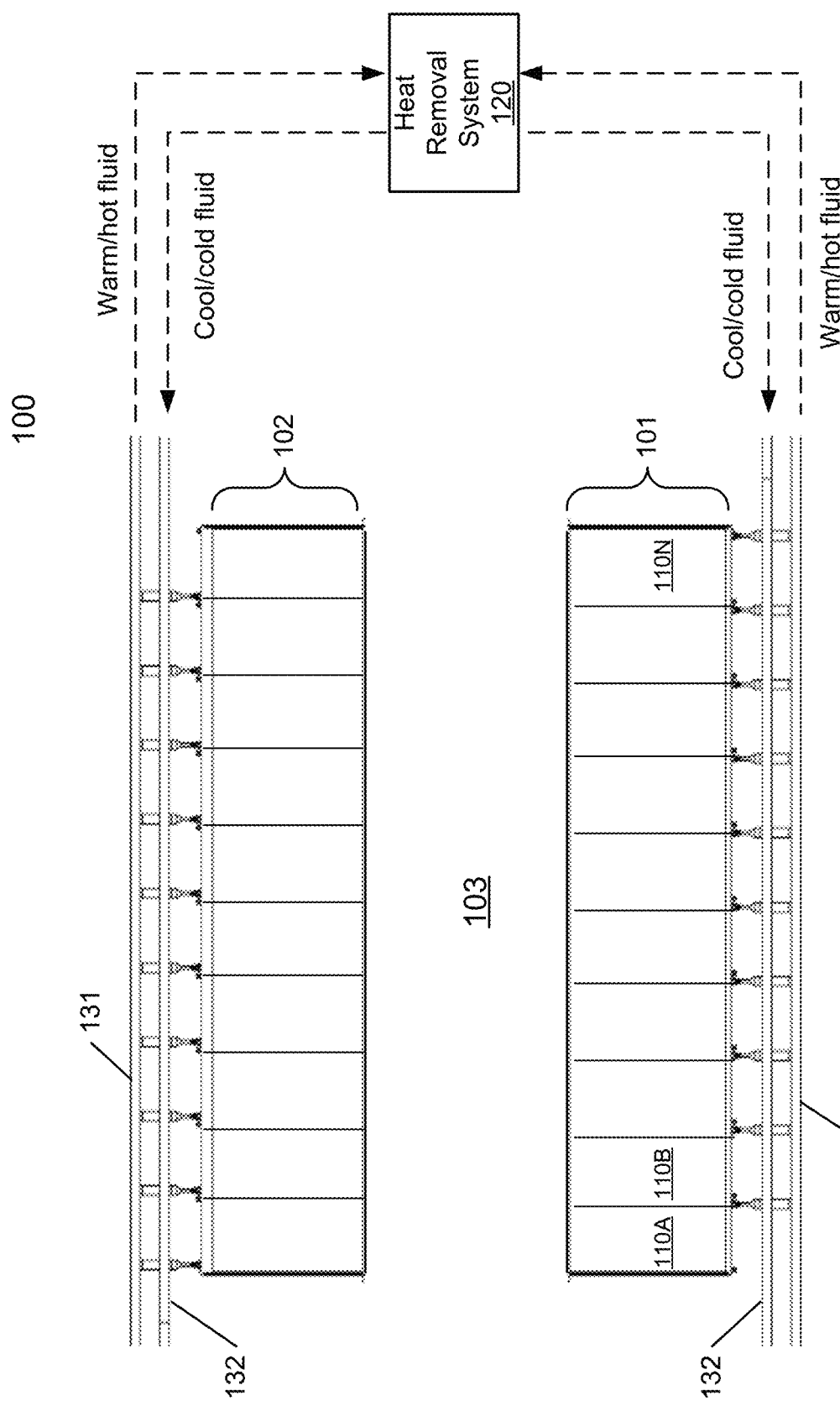
FIG. 1 is a block diagram illustrating an embodiment of a data center.

FIG. 1 is a block diagram illustrating an embodiment of a data center system FIG. 1 shows a top view of at least a portion of a data center system 100. Data center system 100 includes rows of electronic racks of IT components, equipment or instruments 101-102, such as, for example, computer servers that provide data services to a variety of clients. In this embodiment data center system 100 includes electronic racks, such as electronic racks 110A-110N, arranged in row 101 and row 102, but in other embodiments can have more or fewer rows than shown. Typically, rows 101-102 are aligned in parallel with front ends facing each other and back ends facing away from each other, forming aisle 103 in between to allow an administrative person walking therein. However, other configurations or arrangements can also be applied.

In one embodiment, each electronic rack (e.g., electronic racks 110A-110N) includes a back panel, a number of server slots, and a number of server blades capable of being inserted into and removed from the server slots. Each server blade includes a processor (e.g., CPU or GPU), a memory, and/or a persistent storage device (e.g., hard disk), which represents a computer server. The back panel is disposed on a back end of the electronic rack. The back panel includes a working fluid manifold assembly to provide working fluid from an external heat removal system 120 to remove heat from the server blades. Each server blade can be inserted and removed from a corresponding server slot from a front end of the electronic rack. Heat removal system 120 can be a chiller system with an active refrigeration cycle. Alternatively, heat removal system 120 can include but not limited to evaporative cooling, free air, rejection to large thermal mass, and waste heat recovery designs.

In one embodiment, each electronic rack in rows 101-102 includes a working fluid manifold, a number of server blades contained in a number of server blade slots, and a coolant distribution unit (CDU). The working fluid manifold provides working fluid to each of the server blades. Each sever blade receives working fluid from the working fluid manifold, to remove at least a portion of the heat generated by an IT component of the server blade using the working fluid manifold, and to transmit warmer liquid carrying the heat exchanged from the IT component back to the working fluid manifold. The CDU is configured to receive data representing a workload of the IT components of the server blades and to control a liquid flow rate of the working fluid supplied to the working fluid manifold based on the workload of the IT components of the server blades.

The working fluid manifold disposed on the back end of each electronic rack is coupled to liquid supply line 132 to receive working fluid from heat removal system 120. The working fluid is to remove heat from the IT component. The resulting warmer or hotter liquid carrying the heat exchanged from the IT component is transmitted via return line 131 back to heat removal system 120. Liquid supply/return lines 131-132 are referred to as data center liquid supply/return lines (e.g., global liquid supply lines), which supply working fluid to all of the electronic racks of rows 101-102.

Figure 2:
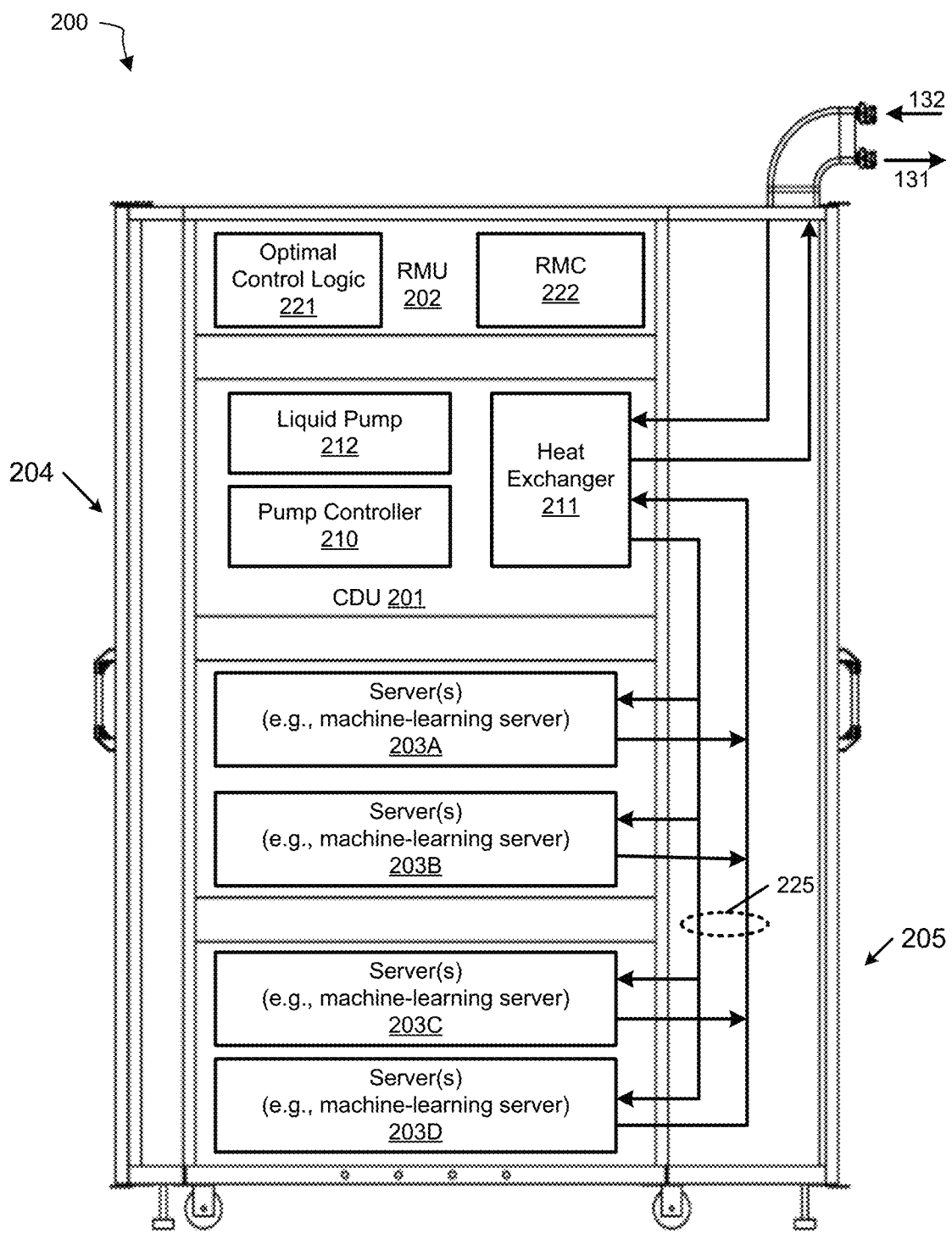
FIG. 2 is a block diagram illustrating an embodiment of an electronic rack.

FIG. 2 is a block diagram illustrating a side view of an embodiment of an electronic rack. Electronic rack 200 can represent any of the electronic racks of rows 101-102 of FIG. 1, such as electronic racks 110A-110N. In one embodiment, electronic rack 200 includes CDU 201, rack management unit (RMU) 202, and one or more server blades 203A-203D, collectively referred to as server blades 203. Sever blades 203 can be inserted into an array of server slots respectively from front end 204 of electronic rack 200. Note that although only four server blades 203A-203D are shown, more or fewer server blades can be maintained within electronic rack 200. Also note that the particular positions of CDU 201, CMU 202, and server blades 203 are shown for the purpose of illustration only; other arrangements or configurations of CDU 201, CMU 202, and server blades 203 can also be implemented. Further, the front door disposed on front end 204 and the back door disposed on back end 205 are optional. In some embodiments, there can no door on front end 204 and/or back end 205.

In one embodiment, CDU 201 includes heat exchanger 211, liquid pump 212, and pump controller 210. Heat exchanger 211 can be a liquid-to-liquid heat exchanger. Heat exchanger 211 includes a first tube having a first pair of liquid connectors coupled to external liquid supply/return lines 131-132 to form a primary loop, where the connectors coupled to the external liquid supply/return lines 131-132 can be disposed or mounted on back end 205 of electronic rack 200. In addition, heat exchanger 211 further includes a second tube having a second pair of liquid connectors coupled to liquid manifold 225, which can include a supply manifold to supply cooling liquid to server blades 203 and a return manifold to return warmer liquid back to CDU 201. The processors can be mounted on the cold plates, where the cold plates include a liquid distribution channel embedded therein to receive the cooling liquid from the liquid manifold 225 and to return the cooling liquid carrying the heat exchanged from the processors back to the liquid manifold 225.

Each server blade 203 can include one or more IT components (e.g., CPUs, GPUs, memory, and/or storage devices). Each IT component can perform data processing tasks, where the IT component can include software installed in a storage device, loaded into the memory, and executed by one or more processors to perform the data processing tasks. Server blades 203 can include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which can generate heat during the operations.

Electronic rack 200 further includes RMU 202 configured to provide and manage power supplied to server blades 203 and CDU 201. RMU 202 can be coupled to a power supply unit (not shown) to manage the power consumption of the power supply unit, as well as other thermal management of the power supply unit (e.g., cooling fans). The power supply unit can include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimal control logic 221 and rack management controller (RMC) 222. The optimal control logic 221 is coupled to at least some of server blades 203 to receive operating status of each of the server blades 203, such as processor temperatures of the processors, the current pump speed of the liquid pump 212, and liquid temperature of the cooling liquid, etc. Based on this information, optimal control logic 221 determines an optimal pump speed of the liquid pump 212 by optimizing a predetermined objective function, such that the output of the objective function reaches the maximum while a set of predetermined constraints is satisfied. Based on the optimal pump speed, RMC 222 is configured to send a signal to pump controller 210 to control the pump speed of liquid pump 212 based on the optimal pump speed.

According to one embodiment, a connector (not shown) placed between a backend of at least some of servers 203 and rack manifold 225 for liquid cooling solution. The connector includes a blind-mating feature and flow distribution feature. The dripless blind-mate feature is for connecting to rack manifold 225 for liquid cooling, which simply requires the operator push a server into a rack and close the latches. The flow distribution feature makes the connector work as a mini-manifold in the server chassis 203. Among other features and advantages, the connector design includes rounded rectangular male and female interfaces; has a blind-mate feature on the male/female interface side and can be substantially dripless; distributes a liquid flow to multiple fluid distribution ports; and can work the same in multiple orientations. Detailed of the connector will be described further below.

Figure 3:
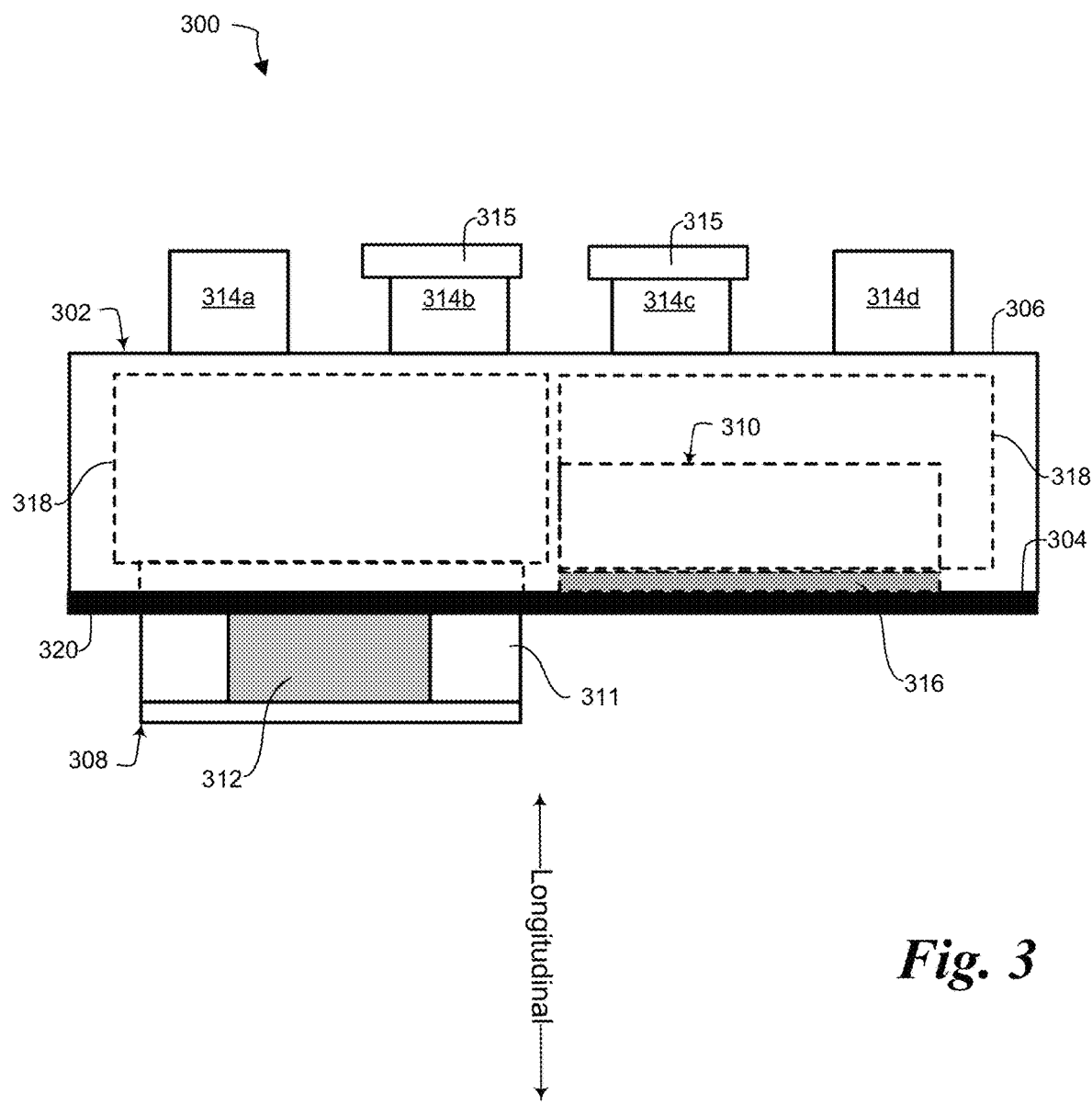
FIG. 3 is a top view of an embodiment of a fluid connector that can be used in embodiments of a data center and an electronic rack such as the ones shown in FIGS. 1-2.

FIG. 3 illustrates an embodiment of a fluid connector 300 that can be used in electronic racks in a data center such as an electronic rack as shown in FIG. 2. Among other things, fluid connector 300 can be used to couple the liquid cooling systems of individual information technology (IT) equipment in a rack to the rack's cooling system (see FIG. 4) or can be used to couple the rack's cooling system to the data center's cooling system.

Fluid connector 300 includes a connector body 302 having a first exterior surface 304 and a second exterior surface 306. In the illustrated embodiment first exterior surface 304 and second exterior surface 306 are planar and substantially parallel to each other—i.e., both have normal vectors parallel to the longitudinal direction—but in other embodiments they need not be planar or parallel to each other. As used herein, the term "longitudinally" refers to the longitudinal direction illustrated by the arrow in FIG. 3. The terms "transverse," "transversely," "lateral," and "laterally" refer to directions normal to the longitudinal direction. In the illustrated embodiment, for instance, the side-to-side direction in the plane of the page, or the direction normal to the plane of the page, can both be considered transverse or lateral.

A male interface 308 projects longitudinally outwardly from first surface 304 and includes an interface body 311 within which there are a pair of fluid gates 312 that can allow or prevent fluid flow into and through male interface 308 (see FIGS. 5A-5C). A female interface 310 is positioned adjacent to male interface 308 on first exterior surface 304. The female interface is longitudinally recessed into first surface 304, so that it projects into the interior of connector body 302. Female interface 310 includes a fluid gate 316 that can either allow or prevent fluid flow into and through female interface 310. Details of the male and female interfaces are further discussed below. Male interface 308 is designed to engage with a corresponding female interface 310 on another fluid connector 300, and female interface 310 is similarly designed to engage with a corresponding male interface 308 on another fluid connector 300 (see, e.g., FIG. 4).

A plurality of fluid distribution ports 314 are positioned on second exterior surface 306 and project longitudinally outward from the second exterior surface. The fluid distribution ports can distribute the liquid into multiple loops (e.g., 4 loops) of the cooling module in the IT server; in one embodiment the connector works as a mini-manifold on this side. It could be barbed fitting with thermal compression on the hoses for permanent connections to the liquid loops inside the server chassis.

The illustrated embodiment has four fluid distribution ports 314a-314b, but other embodiments can have more or less fluid distribution ports than shown. In one embodiment at least one fluid distribution port 314 is an inlet port and at least one fluid distribution port 314 is an outlet port, but other embodiments can have multiple inlets port and/or multiple outlet ports. In still other embodiments all the fluid distribution ports can be inlet ports, so that fluid connector 300 acts as a supply manifold, or all the fluid distribution ports can be outlet ports, so that fluid connector 300 acts as a return manifold. In still further embodiments the number of inlet ports need not be the same as the number of outlet ports. In applications where not all fluid distribution ports 304 are in use, the fluid distribution ports that are not in use can be capped with a sealed cap 315. For instance, if in the illustrated embodiment only fluid distribution ports 314a and 314d are being used, fluid distribution ports 314b and 314c can be sealed off with sealed caps 315.

Fluid distribution ports 314 are fluidly coupled to male interface 308 and female interface 310. In the illustrated embodiment there are one or more chambers 318 within connector body 302, each chamber being fluidly coupled to at least one fluid distribution port 314 and fluidly coupled to at least one of male interface 308 or female interface 310. With this arrangement, fluid connector 300 behaves like a manifold. Other embodiments of connector body 302 can implement the fluid connector differently, for instance by creating flow channels with the connector body that directly couple at least one port 314 to male interface 308 and at least one port 314 to female interface 310. This connector has two features: dripless blind-mating on the male/female interface side, and on the other side distributing fluids into multiple loops as a manifold.

Figure 4:
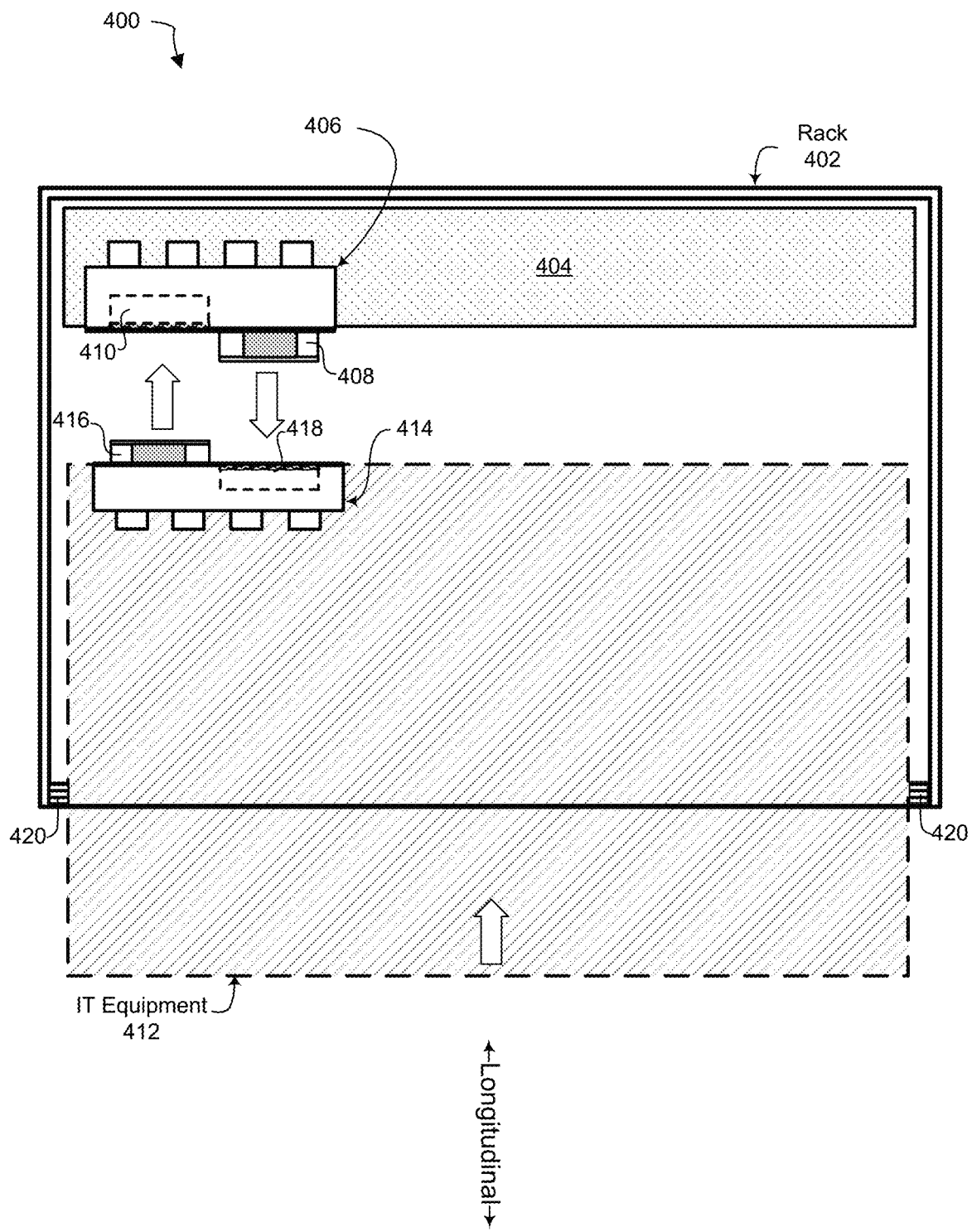
FIG. 4 is an exploded cross-sectional view of an embodiment of a fluid connector such as the one shown in FIG. 3 being used in an electronics rack.

FIG. 4 illustrates an embodiment of a server rack arrangement 400 that uses fluid connector 300. Server rack arrangement 400 can have all the attributes of server rack 200 (FIG. 2): it includes a rack 402 designed to hold one or more pieces of liquid-cooled IT equipment such as servers, blade servers, routers, and the like. Rack 402 includes an internal cooling system 404. In one embodiment cooling system 404 can be self-contained, but in other embodiments it can be coupled to, and be a part of, a larger cooling system such as the cooling system in a data center (see, e.g., FIG. 2). In one embodiment, for instance, rack cooling system 404 can be a rack manifold coupled to the data center cooling system, such as rack manifold 225 (see FIG. 2), but on other embodiments it can be a plurality of fluid-carrying tubes.

At least one fluid connector 406 is fluidly coupled to rack cooling system 404. In one embodiments, there can be one fluid connector 406 coupled to the rack cooling system for each piece of IT equipment—servers, routers, etc.—to be installed in the rack (i.e., a one-to-one correspondence between fluid connectors and IT equipment), but in other embodiments there can be multiple fluid connectors per piece of IT equipment (i.e., a many-to-one correspondence of fluid connectors to IT equipment). In one embodiment fluid connector 406 has the construction of fluid connector 300 illustrated in FIGS. 3 and 5A-5C. The interface structure can be brazed with the rack manifold or directly manufactured as a part of manifold's body.

IT equipment 412 corresponds, for instance, to servers 203 (FIG. 2) and in various embodiments can be servers, blade servers, edge computing servers, routers, and the like. IT equipment 412 is inserted, usually through the front of the rack, into rack 402. At least one fluid connector 414 is fluidly coupled to fluid cooling elements (not shown) that cool one or more individual components, such as processors, memory, storage, etc., that make up IT equipment 412. In one embodiment fluid connector 414 has the construction of fluid connector 300 illustrated in FIGS. 3 and 5A-5C. IT fluid connector 414 is positioned on IT equipment 412 so that it will mate with rack fluid connector 404 when IT equipment 412 is fully inserted into the rack.

When fluid connectors 406 and 414 engage, male interface 408 engages female interface 418 and male interface 416 engages female interface 410. The cushion on the first surface reduces the stress between fluid connectors. Latches 420, or some other locking mechanism, secure IT equipment 412 in its place on the rack and also keep fluid connector 406 and fluid connector 414 engaged. The latches can be positioned on rack 402 or on IT equipment 412. This is also sometimes known as blind coupling, since the fluid connectors automatically slide into engagement without any human intervention. As with rack 402, in one embodiment IT equipment 412 can include a single fluid connector 414 (i.e., a one-to-one correspondence between fluid connectors and IT equipment), but in other embodiments there can be multiple fluid connectors per piece of IT equipment (i.e., a many-to-one correspondence of fluid connectors to IT equipment).

Among the benefits of the illustrated design are: 1) increasing the cross section area of the interface to allow more fluid going through; 2) one single design needed for connecting interface. The connector works as the same when its bottom facing up. It can couple more flexibly with the blind-mate interfaces on the rack manifolds. It can reduce the manufacture cost of the connector with one single design.

FIGS. 5A-5B together illustrate details of the construction of an embodiment of fluid connector 300. FIG. 5A is a front view, FIG. 5B-5C are cross-sectional views of a female interface and a male interface showing how they engage with each other. As described above, fluid connector 300 includes a connector body that has a male interface 308 and a female interface 310. Male interface 308 has a rounded rectangular cross sectional shape and projects longitudinally from the first exterior surface 304 of connector body 302, partially toward the exterior of connector body 302 and partially toward the interior of the connector body. Within male interface 308 is a chamber C1 that is bounded by the body 508 of the male interface, a diaphragm 504, and a pair of spaced-apart laterally-moving fluid gates 312a and 312b. In one embodiment, fluid gates 312a-312b have rounded rectangular shapes that allow enough space for fluid movement. Chamber C1 is sealed by the components that bound it so that no fluid enters the chamber. Fluid gates 312a and 312b are coupled to each other by an elastic member, which in the illustrated embodiment is a spring 506 but in other embodiments can be another type of elastic member. Spring 506 provides a force that biases fluid gates 312a and 312b toward their closed positions, but fluid pressure on the fluid gates can overcome the force of spring 506 and laterally displace or move fluid gates 312a-312b to allow fluid flow (see FIGS. 6A-6B). The material of spring 502 should be compatible with fluid regarding anti-corrosion (e.g., stainless steel).

Female interface 310 has a cross-sectional shape and size that correspond substantially to the cross-sectional shape and size of male interface 308 and projects longitudinally from first exterior surface 304 into the interior of connector body. Within female interface 310 is a chamber C2 that is bounded by the connector body 302 and a longitudinally-moving fluid gate 316. In one embodiment, fluid gate 316 has a rounded rectangular shapes that allow enough space for fluid movement. Chamber C2 is sealed by the components that bound it so that no fluid enters the chamber. Fluid gate 316 is coupled to the portion of connector body 302 at the opposite side of chamber C2 by an elastic member, which in the illustrated embodiment is a spring 502 but in other embodiments can be another type of elastic member. Spring 502 provides a force that biases fluid gate 316 toward its closed position, but the action of inserting the male interface into the female interface, as shown by the arrow in the figure, can overcome the force of spring 502 and longitudinally displace or move fluid gate 316 to allow fluid flow (see FIGS. 6A-6B). The spring force should prevent the moving gate from be pushed in when the connectors are not coupled and exposed to the environment, and the material of spring 502 should be compatible with fluid regarding anti-corrosion (e.g., stainless steel).

In the illustrated embodiment cushion 320 is placed on first exterior surface 304 so that is substantially surrounds both male interface 308 and female interface 310, but in other embodiments the cushion can be positioned differently and need not completely surround the male interface or the female interface. Cushion 320 reduces mechanical stress during coupling.

Figure 6A:
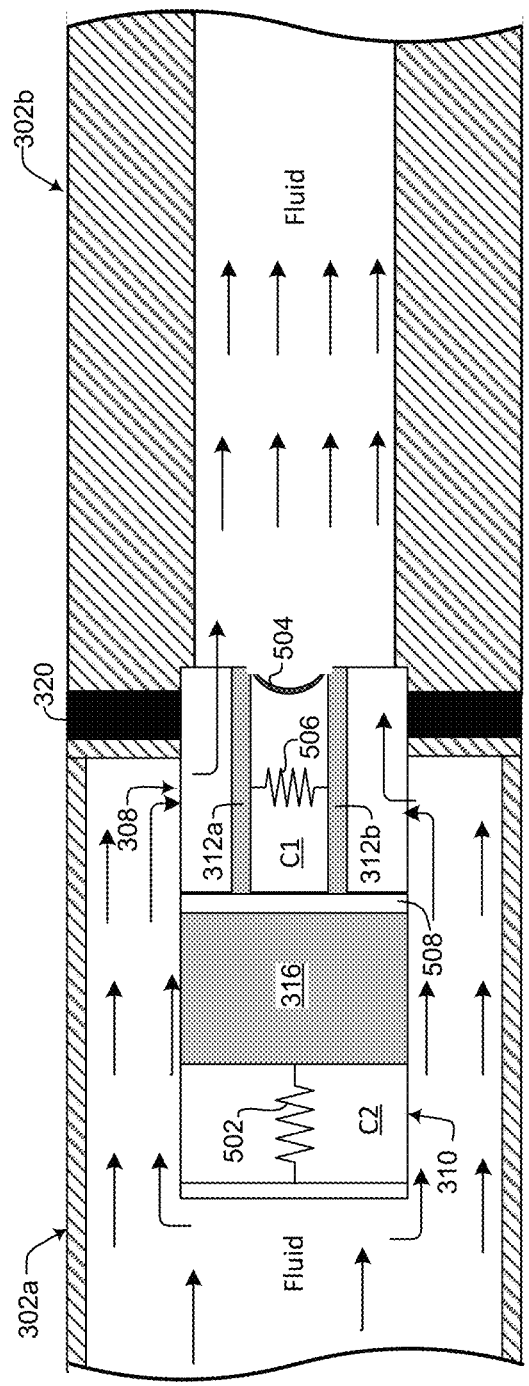
Figure 6B:
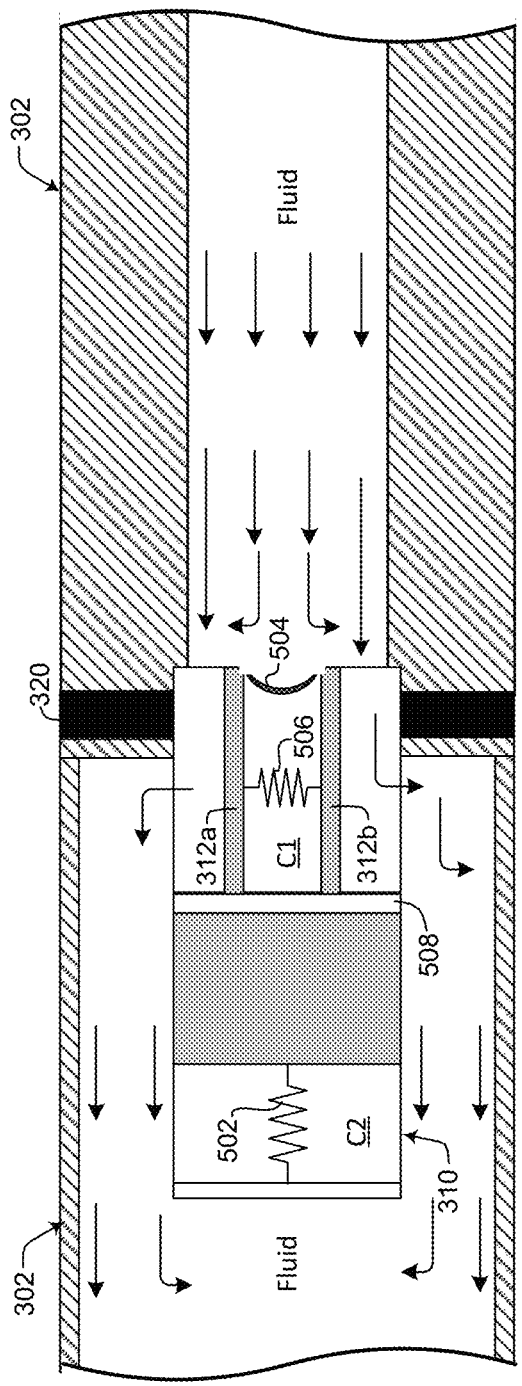

FIGS. 6A-6B illustrate embodiments of the operation of fluid connector 300. At the coupling between a male interface 308 and a female interface 310, fluid can flow in either direction; FIG. 6A illustrated fluid flowing from the female interface to the male interface, while FIG. 6B illustrates fluid flowing the opposite direction from the male interface to the female interface.

FIG. 6A illustrates male interface 308 coupled to a female interface 310, which results when two fluid connectors 300 are engaged as shown in FIG. 4. To couple the male and female interfaces, the connector bodies 302a and 302b of two fluid connectors are brought together so that male interface 308 is inserted into the recessed female interface 310. As body 508 of the male interface is inserted, it pushes upon fluid gate 316, compressing spring 502 and pushing fluid gate 316 from its closed position to its open position. As spring 502 is compressed, chamber C2 shrinks in size but remains sealed from fluid entry. The male interface is pushed into the female interface until cushion 320 of one fluid connector is pressed against cushion 320 if the fluid connector to which it is being coupled.

After the coupling between male and female interfaces is complete, fluid flow can begin from one fluid connector to the other. Fluid flowing into connector body 302a flows around chamber C2 and fluid gate 316 until it reaches fluid gates 312a-312b. With no fluid pressure applied to gates 312a-312b, spring 506 maintains the gates in their closed position, where they allow no fluid flow through male interface 308. But once fluid starts flowing, the fluid pressure exerts a lateral force on fluid gates 312a-312b that pushes them laterally toward each other against the force exerted by spring 506. A minimum fluid pressure is needed to make the fluid pass though the coupled connectors. As fluid gates 312a-312b move toward each other, diaphragm 504 deforms, which both allows the fluid gates to move toward each other and maintains chamber C1 in a sealed state so that no fluid enters the chamber. Once fluid gates 312 move away from their closed positions, a channel is opened through which fluid can flow through female interface 310 and male interface 308 and into connector body 302b.

When it is time to decouple the two fluid connectors, fluid flow through the connectors is stopped. Connector bodies 302a and 302b are pulled apart, so that male interface 308 is withdrawn from female interface 310. As the male interface is withdrawn, spring 502 pushes fluid gate 316 back to its closed position, thus preventing or minimizing the escape of fluid from connector body 302a. Substantially at the same time, as the male interface is withdrawn the fluid pressure acting on fluid gates 312a and 312b drops and spring 506 pushes both fluid gates back to their closed positions, preventing or minimizing the escape of fluid from connector body 302b. Male interface 308 and female interface 310 thus work together to form a blind connection that substantially eliminates, or at least reduces leaks—especially leaks that occur during connection or disconnection. When disconnecting or uncoupling the connectors they are substantially dripless, although a minimal volume of fluid might drip from the interfaces.

FIG. 6B illustrates the arrangement of connector bodies and interfaces shown in FIG. 6A. The primary difference is the flow direction: in FIG. 6A fluid flows through the female interface and male interface from connector 302a to connector 302b, but in FIG. 6B fluid flows the opposite direction, from connector 302b to connector 302a. Otherwise, the connectors and interfaces are coupled and uncoupled, and operate the same way, as discussed above for FIG. 6A.

Other fluid connector embodiments are possible besides the ones described above. For instance:

One connector can have more female and male interfaces than stated above.

One connector can have more ports for flow distribution than stated above.

Additional structural design, such as brackets, screws and bolts, can be implemented for assembling the connectors with server chassis or other system hardware.

The above description of embodiments is not intended to be exhaustive or to limit the invention to the described forms. Specific embodiments of, and examples for, the invention are described herein for illustrative purposes, but various modifications are possible.

What is claimed is:

1. A fluid connector comprising:
   a connector body having at least a first exterior surface and a second exterior surface;
   a male interface projecting longitudinally from the first exterior surface, the male interface including a male internal chamber bounded in part by a pair of spaced-apart laterally-moving fluid gates coupled to each other by a first elastic member;
   a female interface longitudinally adjacent to the male interface and recessed into the first exterior surface, the female interface including a female internal chamber bounded in part by a longitudinally-moving fluid gate, the longitudinally-moving fluid gate being biased into its closed position by a second elastic member; and
   a plurality of fluid distribution ports positioned on the second surface, each of the plurality of fluid distribution ports being fluidly coupled to the male interface, the female interface, or both, wherein the plurality of fluid distribution ports includes at least one fluid inlet or at least one fluid outlet.

2. The fluid connector of claim 1 wherein both the first elastic member and the second elastic member are springs.

3. The fluid connector of claim 1 wherein both the male internal chamber and the female internal chamber are sealed to prevent entry of fluid flowing through the fluid connector.

4. The fluid connector of claim 1 wherein the plurality of fluid distribution ports is fluidly coupled to the male interface and the female interface by a chamber in the connector body, so that the fluid connector acts like a manifold.

5. The fluid connector of claim 1 wherein the male internal chamber is partially bounded by a flexible diaphragm that extends between the pair of laterally-moving fluid gates.

6. The fluid connector of claim 1 wherein the first elastic member biases the pair of laterally-moving fluid gates toward their closed positions.

7. The fluid connector of claim 6 wherein the second elastic member biases the longitudinally-moving gate toward its closed position.

8. The fluid connector of claim 1, further comprising a cushion pad positioned on the first exterior surface at least partially surrounding the male interface and the female interface.

9. The fluid connector of claim 1, further comprising a sealed cap coupled to one or more of the plurality of fluid distribution ports, wherein each sealed cap prevents flow through the fluid distribution port to which is it coupled.

10. A system comprising:
    an electronics rack including a fluid circulation system, the fluid circulation system including at least one rack fluid connector comprising:
       a connector body having at least a first exterior surface and a second exterior surface;
       a male interface projecting longitudinally from the first exterior surface, the male interface including a male internal chamber bounded in part by a pair of spaced-apart laterally-moving fluid gates coupled to each other by a first elastic member;
       a female interface longitudinally adjacent to the male interface and recessed into the first exterior surface, the female interface including a female internal chamber bounded in part by a longitudinally-moving fluid gate, the longitudinally-moving fluid gate being biased into its closed position by a second elastic member; and
       a plurality of fluid distribution ports positioned on the second surface, each of the plurality of fluid distribution ports being fluidly coupled to the male interface, the female interface, or both, wherein the plurality of fluid distribution ports includes at least one fluid inlet or at least one fluid outlet.

11. The system of claim 10 wherein the rack's fluid circulation system is fluidly coupled to a data center fluid circulation system.

12. The system of claim 10, further comprising at least one piece of information technology (IT) equipment having liquid-cooled components thereon, the at least one piece of IT equipment and including at least one IT fluid connector comprising:
    a connector body having at least a first exterior surface and a second exterior surface;
    a male interface projecting longitudinally from the first exterior surface, the male interface including a male internal chamber bounded in part by a pair of spaced-apart laterally-moving fluid gates coupled to each other by a first elastic member;
    a female interface longitudinally adjacent to the male interface and recessed into the first exterior surface, the female interface including a female internal chamber bounded in part by a longitudinally-moving fluid gate, the longitudinally-moving fluid gate being biased into its closed position by a second elastic member; and
    a plurality of fluid distribution ports positioned on the second surface, each of the plurality of fluid distribution ports being fluidly coupled to the male interface, the female interface, or both, wherein the plurality of fluid distribution ports includes at least one fluid inlet or at least one fluid outlet;
    wherein the male interface of server coupling engages the female interface of rack coupling and the female interface of the server engages the male interface of the server coupling.

13. The system of claim 12 wherein in both the rack fluid connector and the IT fluid connector the first elastic member and the second elastic member are springs.

14. The system of claim 12 wherein in both the rack fluid connector and the IT fluid connector both the male internal chamber and the female internal chamber are sealed to prevent entry of fluid flowing through the fluid connector.

15. The system of claim 12 wherein in at least one of the rack fluid connector and the IT fluid connector the plurality of fluid distribution ports is fluidly coupled to the male interface and the female interface by one or more chambers in the connector body, so that the fluid connector acts like a manifold.

16. The system of claim 12 wherein in both the rack fluid connector and the IT fluid connector the male internal chamber is partially bounded by a flexible diaphragm that extends between the pair of laterally-moving fluid gates.

17. The system of claim 12 wherein in both the rack fluid connector and the IT fluid connector the first elastic member biases the pair of laterally-moving fluid gates toward their closed positions.

18. The system of claim 17 wherein in both the rack fluid connector and the IT fluid connector the second elastic member biases the longitudinally-moving gate toward its closed position.

19. The system of claim 12, further comprising:
- a sealed cap coupled to one or more of the plurality of fluid distribution ports of the rack fluid connector,
- a sealed cap coupled to one or more of the plurality of fluid distribution ports of the IT fluid connector, or
- sealed caps coupled to one or more of the plurality of fluid distribution ports of the rack fluid connector and coupled to one or more of the plurality of fluid distribution ports of the IT fluid connector,
- wherein each sealed cap prevents flow through the fluid distribution port to which is it coupled.

20. The system of claim 10, further comprising a cushion pad positioned on the first exterior surface at least partially surrounding the male interface and the female interface.

* * * * *